(12) United States Patent
Son

(10) Patent No.: US 9,502,617 B2
(45) Date of Patent: *Nov. 22, 2016

(54) LIGHT EMITTING DIODE PACKAGE AND METHOD OF MANUFACTURING THE SAME

(71) Applicant: LG INNOTEK CO., LTD., Seoul (KR)

(72) Inventor: Won-Jin Son, Gwangju-si (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/704,678

(22) Filed: May 5, 2015

(65) Prior Publication Data

US 2015/0235997 A1 Aug. 20, 2015

Related U.S. Application Data

(63) Continuation of application No. 13/914,119, filed on Jun. 10, 2013, now Pat. No. 9,029,903, which is a continuation of application No. 12/814,336, filed on Jun. 11, 2010, now Pat. No. 8,471,271, which is a continuation of application No. 11/709,764, filed on Feb. 23, 2007, now Pat. No. 8,115,214.

(30) Foreign Application Priority Data

Feb. 23, 2006 (KR) .................. 10-2006-0017476

(51) Int. Cl.
*H01L 33/48* (2010.01)
*H01L 25/075* (2006.01)
(Continued)

(52) U.S. Cl.
CPC ........... *H01L 33/48* (2013.01); *H01L 25/0753* (2013.01); *H01L 33/38* (2013.01); *H01L 33/483* (2013.01); *H01L 33/486* (2013.01); *H01L 33/50* (2013.01); *H01L 33/62* (2013.01)

(58) Field of Classification Search
None
See application file for complete search history.

(56) References Cited

U.S. PATENT DOCUMENTS

| 4,918,497 A | 4/1990 | Edmond |
| 5,408,109 A | 4/1995 | Heeger et al. |

(Continued)

FOREIGN PATENT DOCUMENTS

| JP | 10-247748 A | 9/1998 |
| JP | 10-284759 A | 10/1998 |

(Continued)

OTHER PUBLICATIONS

Boylestad, Rober. Introductory Circuit Analysis 3rd edition. USA: Bell & Howell Company, 1977.

*Primary Examiner* — Fei Fei Yeung Lopez
(74) *Attorney, Agent, or Firm* — Birch, Stewart, Kolasch & Birch, LLP

(57) ABSTRACT

A light emitting diode package including a package body with a cavity, a plurality of light emitting diode (LED) chips in the cavity, a plurality of wires connected to the plurality of LED chips, and a plurality of lead frames in the package body, wherein the lead frames comprise a first lead frame electrically connected to a first electrode of a first LED chip, a second lead frame electrically connected to a second electrode of the first LED chip and a second electrode of a second LED chip, a third lead frame electrically connected to a first electrode of the second LED chip, and fourth lead frame electrically connected to a second electrode of a third LED chip. Further, ends of the lead frames are exposed outside of the package body and penetrate the package body, and the first electrodes are P electrodes and the second electrodes are N electrodes.

20 Claims, 4 Drawing Sheets

(51) Int. Cl.
*H01L 33/38* (2010.01)
*H01L 33/50* (2010.01)
*H01L 33/62* (2010.01)

(56) References Cited

U.S. PATENT DOCUMENTS

| | | | |
|---|---|---|---|
| 6,198,529 B1* | 3/2001 | Clark, Jr. | G01N 21/95684 |
| | | | 356/237.5 |
| 6,401,807 B1 | 6/2002 | Wyler et al. | |
| 6,496,162 B2 | 12/2002 | Kawakami et al. | |
| 6,540,377 B1 | 4/2003 | Ota et al. | |
| 6,849,876 B1 | 2/2005 | Chen et al. | |
| 7,026,660 B2 | 4/2006 | Guenther et al. | |
| 7,361,937 B2 | 4/2008 | Chen | |
| 7,386,025 B2 | 6/2008 | Omori et al. | |
| 9,029,903 B2* | 5/2015 | Son | H01L 25/0753 |
| | | | 257/100 |
| 2002/0113246 A1 | 8/2002 | Nagai et al. | |
| 2002/0130786 A1 | 9/2002 | Weindorf | |
| 2002/0190262 A1 | 12/2002 | Nitta et al. | |
| 2003/0160256 A1 | 8/2003 | Durocher et al. | |
| 2004/0206964 A1 | 10/2004 | Matsumura et al. | |
| 2004/0245532 A1 | 12/2004 | Maeda et al. | |
| 2005/0082974 A1 | 4/2005 | Fukasawa et al. | |
| 2005/0110036 A1 | 5/2005 | Park et al. | |
| 2005/0122031 A1 | 6/2005 | Itai et al. | |
| 2005/0127816 A1* | 6/2005 | Sumitani | H01L 25/0753 |
| | | | 313/498 |
| 2005/0176160 A1 | 8/2005 | Hsu | |
| 2006/0027826 A1 | 2/2006 | Goodrich | |
| 2006/0038477 A1 | 2/2006 | Tamaki et al. | |
| 2006/0049475 A1 | 3/2006 | Wang et al. | |
| 2006/0054913 A1 | 3/2006 | Hadame et al. | |
| 2006/0065957 A1 | 3/2006 | Hanya | |
| 2006/0081862 A1 | 4/2006 | Chua et al. | |
| 2006/0285566 A1 | 12/2006 | Ueki | |
| 2007/0001188 A1 | 1/2007 | Lee | |
| 2007/0020916 A1 | 1/2007 | Farnworth | |
| 2007/0069643 A1 | 3/2007 | Brunner et al. | |

FOREIGN PATENT DOCUMENTS

| | | |
|---|---|---|
| JP | 11-45958 A | 2/1999 |
| JP | 2000-232186 A | 8/2000 |
| JP | 2001-326389 A | 11/2001 |
| JP | 2003-78172 A | 3/2003 |
| JP | 2004-71675 A | 3/2004 |
| JP | 2004-214338 A | 7/2004 |
| JP | 2004-228413 A | 8/2004 |
| JP | 2006-41230 A | 2/2006 |
| JP | 2006-41380 A | 2/2006 |
| KR | 10-2001-0051594 A | 6/2001 |
| WO | 2005/022654 A2 | 3/2005 |

* cited by examiner

300

LIGHT EMITTING DIODE PACKAGE AND METHOD OF MANUFACTURING THE SAME

CROSS REFERENCE TO RELATED APPLICATIONS

This application is continuation of application Ser. No. 13/914,119, filed Jun. 10, 2013, which is a continuation of application Ser. No. 12/814,336, filed Jun. 11, 2010, U.S. Pat. No. 8,471,271, issued Jun. 25, 2013, which is a Continuation of application Ser. No. 11/709,764, filed Feb. 23, 2007, U.S. Pat. No. 8,115,214, issued Feb. 14, 2012, and claims priority under 35 U.S.C. §119 on Korean Application No. 10-2006-0017476, filed Feb. 23, 2006. The entire contents of which are hereby incorporated by reference in their entirety.

BACKGROUND OF THE INVENTION

1. Field of the Invention

The embodiment of present invention relates to a light emitting diode package and a method of manufacturing the same.

2. Description of the Related Art

A light emitting diodes (LED) reproduces various colors by using compound semiconductor materials such as GaAs, AlGaAs, GaN, InGaN, and InGaAlP to compose a light emitting source. The LED has been applied to various fields, such as a lighting display device, a character display device, and an image display device, which uses one or more LEDs to display an original color or various colors.

Characteristics of the LED are generally determined by a material, color and brightness, the range of the brightness, and the like. In particular, the characteristics of the LED are greatly influenced by the package structure for mounting LED chip(s).

FIG. 1 is a sectional view of an LED package according to a related art.

Referring to FIG. 1, an LED package 10 includes a substrate 20 with a cavity formed at its upper portion, a reflective electrode layer 21, an LED chip 30, a filler 40, and a mold lens 50.

The reflective electrode layer 21 is formed of an Ag metal in the cavity at an upper portion of the substrate 20, and is electrically disconnected. Both ends of the reflective electrode layer 21 extend to an edge of the substrate 20 and are connected to two electrode terminals 22 and 23.

The LED chip 30 is a blue LED chip, and includes P and N electrodes bonded to the reflective electrode layer 21 using a wire 31.

The cavity of the substrate 20 is filled with the filler 40. The filler 40 is formed of resin such as epoxy, and is molded in order to prevent the oxidation of the LED chip 30, the wire 31, and a boding portion, reduce a light loss due to an air resistance, and improve thermal conductivity. The mold lens 50 is attached onto the filler 40.

In the LED package 10, light generated from the LED chip 30 radiates out through the filler 40 and the mold lens 50, or is reflected from the reflective electrode layer 21 and then radiated out through the filler 40 and the mold lens 50.

However, it is difficult to mount a plurality of LED chips using the LED package 10 that has the above-described reflective electrode layer structure, and thus it is difficult to manufacture an LED package that emits lights of various colors.

SUMMARY OF THE INVENTION

An embodiment of the present invention provides to an LED package and a method of manufacturing the same that substantially obviate one or more problems due to limitations and disadvantages of the related art.

An embodiment of the present invention provides an LED package where a plurality of LED chips are easily disposed on lead frames according to a circuit composition and kinds of LED chips and a method of manufacturing the same.

An embodiment of the present invention provides a light emitting diode package, comprising: a package main body with a cavity; a plurality of light emitting diode chips mounted in the cavity; a wire connected to an electrode of at least one light emitting diode chip; and a plurality of lead frames formed in the package main body, wherein at least one lead frame is electrically connected to the light emitting diode chip or a plurality of wires.

An embodiment of the present invention provides a method of manufacturing a light emitting diode package, the method comprising: forming a package main body including a cavity with a plurality of lead frames formed therein; attaching a plurality of light emitting diode chips into the cavity; and bonding the light emitting chip and/or the one or more wires to at least one lead frame.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, an LED package and a method of manufacturing the same according to embodiments of the present invention will be described with reference to the accompanying drawings.

Figure 1:
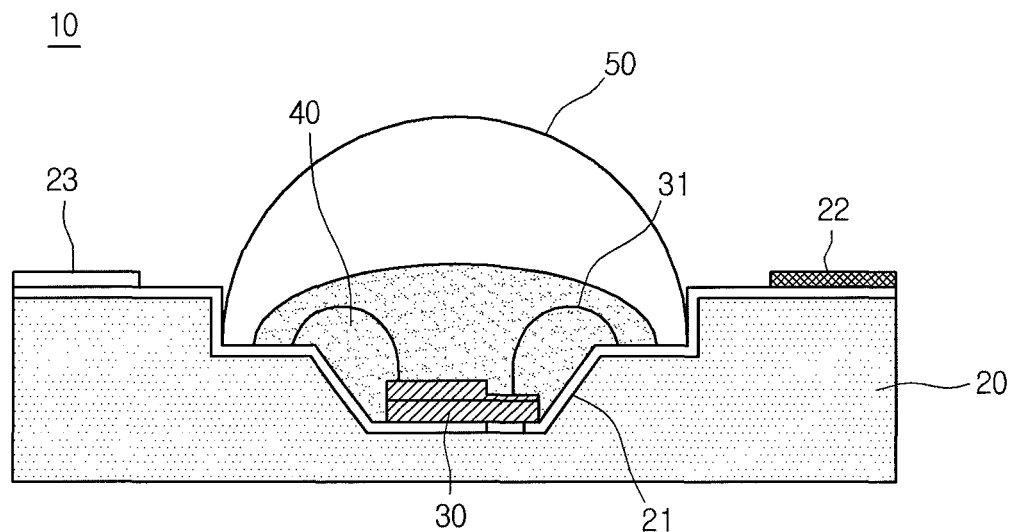
FIG. 1 is a sectional view of an LED package according to a related art.
Figure 2A:
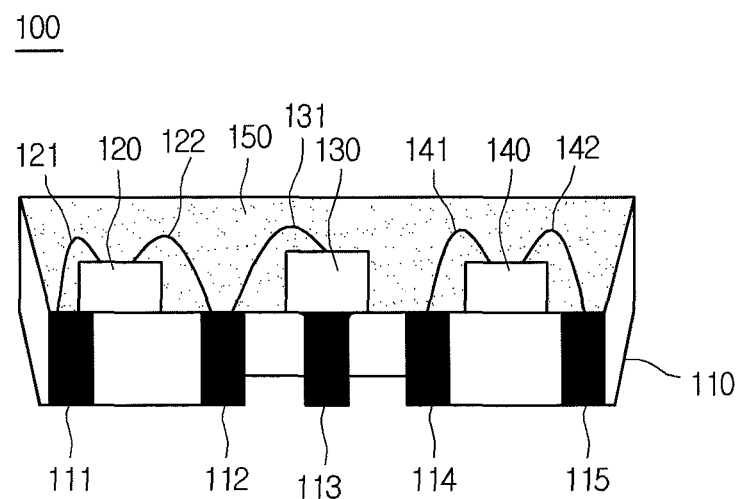
FIG. 2A is a side sectional view of an LED package according to a first embodiment of the present invention.
Figure 2B:
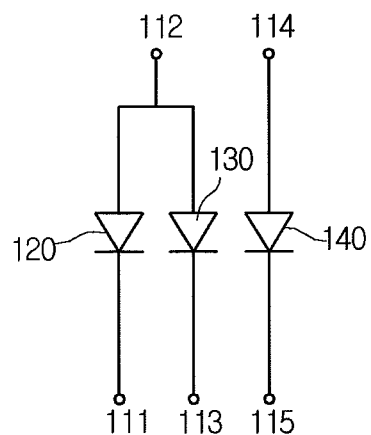
FIG. 2B is a circuit diagram of LEDs of FIG. 2A.

FIG. 2A is a side sectional view of an LED package according to a first embodiment of the present invention. FIG. 2B is a circuit diagram of LEDs of FIG. 2A.

Referring to FIG. 2A, an LED package 100 includes a package main body 110 with a cavity, a plurality of lead frames 111~115, a plurality of LED chips 120, 130 and 140, and a mold member 150 to provide light laterally.

The package main body 110 may be formed by performing injection-molding using plastic materials such as polycarbonate (PC), polycarbonate acrylonitrile butadiene styrene (PCABS), polyphthalamide (PPA), nylon, polyethylene terephtalate (PET), and polybutylene terephtalate (PBT).

The lead frames 111~115 are formed inside the cavity when molding the package main body 110. The cavity is formed to a predetermined depth at an upper portion of the package main body 110, and may have an upper diameter larger than a lower diameter. For example, each side surface of the cavity may be formed so as to lean outward at 105-120 degree angle, thereby increasing the light emitting efficiency.

The plurality of lead frames 111~115 are formed at a lower portion of the cavity of the package main body 110 and are electrically disconnected with each other. Ends of the lead frames 111~115 penetrate the package main body 110 such that they are exposed outside and used as electrode leads.

The number of the lead frames 111~115 is smaller than that of electrodes of the plurality of LED chips 120, 130 and 140 by one. The lead frames 111~115 are spaced from each other by a predetermined distance and disposed in a line, in a length direction of the package main body 110.

The plurality of LED chips 120, 130 and 140 may be composed of LED chips of three colors or single colored LED chips. The LED chips of three colors may be a blue LED chip 120, a red LED chip 130, and a green LED chip 140. All of the single colored LED chips may be blue LED chips.

The plurality of LED chips 120, 130 and 140 may include horizontal LED chips 120 and 140 where two electrodes (N, P) are horizontally disposed at an upper side of the LED chip, and/or the vertical LED chip 130 where two electrodes are disposed at upper and lower sides of the LED chip, respectively.

The LED chips 120, 130 and 140 may be adhered to the lead frames 111~115 in the cavity or to a lower side of the cavity of the package main body 110. Here, the horizontal LED chips 120 and 140 are adhered using a nonconductive adhesive. An N electrode disposed at a lower side of the vertical LED chip 130 is die-bonded to any one lead frame 113 using a conductive adhesive.

When the LED chips 120, 130 and 140 are adhered, upper electrodes of the LED chips 120, 130 and 140 are bonded to the lead frames 111, 112, 114 and 115 through wires 121, 122, 131, 141 and 142. Here, upper electrodes (N, P) of the horizontal LED chips 120 and 140 are connected to the first and second lead frames 111 and 112 and the fourth and fifth lead frames 114 and 115, respectively. The vertical LED chip 130 includes an N electrode (or a P electrode) at a lower side of the vertical LED chip 130 connected to the third lead frame 113, and a P electrode (or a N electrode) at an upper side the vertical LED chip 130 connected to the second lead frame 112 through the wire 131.

In detail, referring to FIGS. 2A and 2B, the blue LED chip 120 has a horizontal electrode structure, and includes the N and P electrodes connected to the first and second frames 111 and 112 through the wires 121 and 122, respectively. The red LED chip 130 has a vertical electrode structure, and includes the N electrode at a lower side of the red LED chip 130 connected to the third lead frame 113 and the P electrode at an upper side of the red LED chip 130 connected to the second lead frame 112 through the wire 131. The green LED chip 140 has a horizontal electrode structure, and includes the P electrode connected to the fourth lead frame 114 through the wire 141 and the N electrode connected to the fifth lead frame 115 through the wire 142.

Here, the P electrodes of the blue LED chip 120 and the red LED chip 130 may be connected with commonness to the second lead frame 112 (a common anode configuration). In the present invention, At least one of the three LED chips 120, 130 and 140 may have a horizontal or/and vertical electrode structure. Also, when positions for mounting the blue LED chip 120 and the green LED chip 140 are changed with each other, the P electrodes of the red LED chip 130 and the green LED chip 140 may be connected with commonness to the second lead frame 112.

Also, N and P electrode leads of the LED chips 120, 130 and 140 may be alternately formed in the five lead frames 111~115 disposed in a line in the cavity. For example, an N electrode lead is disposed in the first lead frame 111, a P electrode lead is disposed in the second lead frame 112, an N electrode lead is disposed in the third frame 113, a P electrode lead is disposed in the fourth lead frame 114, and an N electrode lead is disposed in the fifth lead frame 115.

The mold member 150 is formed in the cavity of the package main body 110. The mold member 150 is formed of resin such as epoxy and silicon, and is filled within the cavity so as to protect the LED chips 120, 130 and 140, the wires 121, 122, 131, 141 and 142, and the bonding portion. The mold member 150 may be not formed inside the cavity when the LED package 100 can emit light of a desired color.

The mold member 150 may have a surface of a flat shape, a concave lens shape or a convex lens shape. Such a surface shape may be changed according to a use or an object of the LED package 100.

In the first embodiment of the present invention, the LED chip 130 among the three LED chips 120, 130 and 140 has a vertical electrode structure where its P electrode is disposed at an upper side of the LED chip 130, and the P electrodes may be connected to one lead frame 112 of the five lead frames 111~115 (a common anode configuration).

Figure 3A:
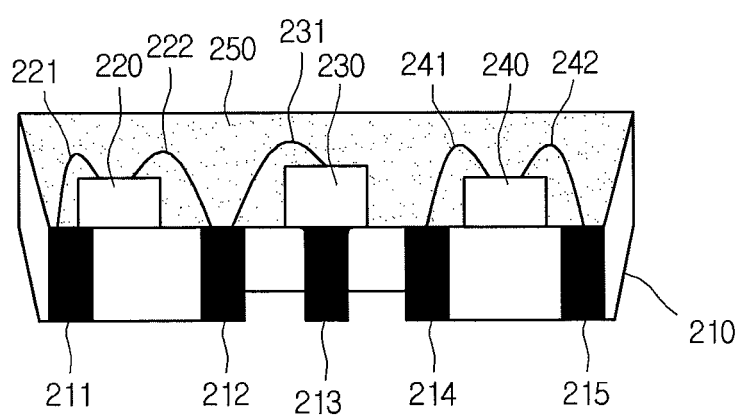
FIG. 3A is a side sectional view of an LED package according to a second embodiment of the present invention.
Figure 3B:
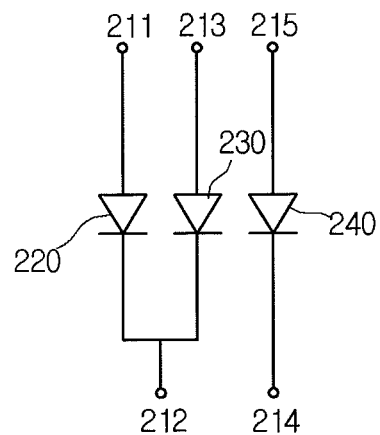
FIG. 3B is a circuit diagram of LEDs of FIG. 3A.

FIG. 3A is a side sectional view of an LED package according to a second embodiment of the present invention. FIG. 3B is a circuit diagram of LEDs of FIG. 3A.

Referring to FIGS. 3A and 3B, an LED package 200 includes a package main body 210 with a cavity, a plurality of lead frames 211~215, a plurality of LED chips 220, 230 and 240, and a mold member 250.

The package main body 210 may be formed by performing injection-molding using plastic materials such as polycarbonate (PC), polycarbonate acrylonitrile butadiene styrene (PCABS), polyphthalamide (PPA), nylon, polyethylene terephtalate (PET), and polybutylene terephtalate (PBT). The lead frames 211~215 are formed inside the cavity when molding the package main body 210. The cavity is formed to a predetermined depth at an upper portion of the package main body 210, and may have an upper diameter larger than a lower diameter. For example, each side surface of the cavity may be formed so as to lean outward at 105-120 degree angle, thereby increasing the light emitting efficiency.

The plurality of lead frames 211~215 are formed at a lower portion of the cavity of the package main body 210 and are electrically disconnected with each other. Ends of the lead frames 211~215 penetrate the package main body 210 such that they are exposed outside and used as electrode leads.

The number of the lead frames 211~215 is smaller than that of electrodes of the number of the plurality of LED chips 220, 230 and 240 by one. The lead frames 211~215 are spaced from each other by a predetermined distance and disposed in a line, in a length direction of the package main body 210.

The plurality of LED chips 220, 230 and 240 may be composed of LED chips of three colors or single colored LED chips. The LED chips of three colors may be a blue LED chip 220, a red LED chip 230, and a green LED chip 240. All of the single colored LED chips may be blue LED chips.

The plurality of LED chips 220, 230 and 240 may include horizontal LED chips 220 and 240 where two electrodes (N, P) are horizontally disposed at an upper side of the LED chip 220 and 240, and/or the vertical LED chip 230 where two electrodes are disposed at upper and lower sides of the LED chip 230, respectively.

The LED chips 220, 230 and 240 may be adhered to the lead frames 211~215 in the cavity or to the package main body 210. Here, the horizontal LED chips 220 and 240 are adhered using a nonconductive adhesive. A P electrode at a lower side of the vertical LED chip 230 is die-bonded to any one lead frame 213 using a conductive adhesive.

When the LED chips 220, 230 and 240 are adhered, electrodes of the LED chips 220, 230 and 240 are bonded to the lead frames 211~215 through wires 221, 222, 231, 241 and 242. Here, electrodes (N, P) of the horizontal LED chip 220 are connected to the first and second lead frame 211 and 212, respectively. The vertical LED chip 230 includes an P electrode at a lower side of the vertical LED chip electrically connected to the third lead frame 213, and an N electrode at an upper side of the vertical LED chip bonded to the second lead frame 212 through the wire 231.

In detail, the blue LED chip 220 has a horizontal electrode structure, and includes the P electrode connected to the first lead frame 211 through the wire 221 and the N electrode connected to the second lead frame 212 through the wire 222. The red LED chip 230 has a vertical electrode structure, and includes the P electrode at a lower side of the red LED chip electrically connected to the third lead frame 213 and the N electrode at an upper side of the red LED chip connected to the second lead frame 212 through the wire 231. The green LED chip 240 has a horizontal electrode structure, and includes the P electrode connected to the fourth lead frame 214 through the wire 241 and the N electrode connected to the fifth lead frame 215 through the wire 242.

Here, the N electrodes of the blue LED chip 220 and the red LED chip 230 may be connected with commonness to the second lead frame 212 (a common cathode configuration). In the present invention, At least one of the three LED chips 220, 230 and 240 may have a horizontal or/and vertical electrode structure. Also, when positions for mounting the blue LED chip 220 and the green LED chip 240 are changed with each other, the N electrodes of the green LED chip 240 and red LED chip 230 may be connected with commonness to the second lead frame 212.

Also, N and P electrode leads of the LED chips 220, 230 and 240 may be alternately formed in the five lead frames 211~215 disposed in a line in the cavity.

For example, a P electrode lead is disposed in the first lead frame 211, an N electrode lead is disposed in the second lead frame 212, a P electrode lead is disposed in the third frame 213, an N electrode lead is disposed in the fourth lead frame 214, and a P electrode lead is disposed in the fifth lead frame 215.

The mold member 250 is formed in the cavity of the package main body 210. The mold member 250 is formed of resin such as transparent epoxy and silicon, and is filled within the cavity so as to electrically protect the LED chips 220, 230 and 240, the wires 221, 222, 231, 241 and 242, and the bonding portion.

The mold member 250 may have a surface of a flat shape, a concave lens shape or a convex lens shape. Such a surface shape may be changed according to a use or an object of the LED package 200. The mold member 250 may be not formed in the cavity when the LED package 200 can emit light of a desired color.

In the second embodiment of the present invention, the LED chip 230 among the three LED chips 220, 230 and 240 has a vertical electrode structure where its N electrode is disposed at an upper portion of the LED chip 230, and the N electrodes of the two LED chips 220 and 230 may be connected with commonness to one lead frame 212 of the five lead frames 211~215 (a common cathode configuration).

Figure 4A:
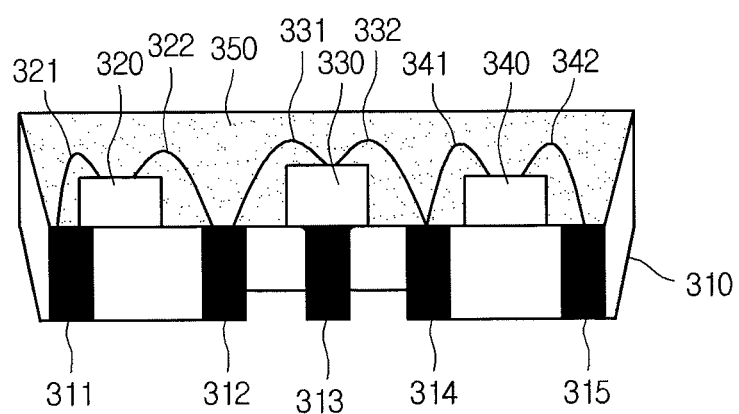
FIG. 4A is a side sectional view of an LED package according to a third embodiment of the present invention.
Figure 4B:
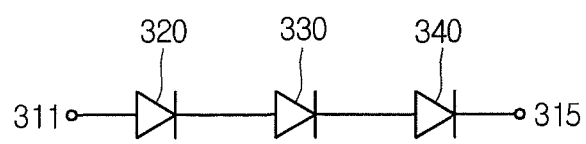
FIG. 4B is a circuit diagram of LEDs of FIG. 4A.

FIG. 4A is a side sectional view of an LED package according to a third embodiment of the present invention. FIG. 4B is a circuit diagram of LEDs of FIG. 4A.

Referring to FIGS. 4A and 4B, an LED package 300 includes a package main body 310 with a cavity, a plurality of lead frames 311~315, a plurality of LED chips 320, 330 and 340, and a mold member 350.

The package main body 310 may be formed by performing injection-molding using such as polycarbonate (PC), polycarbonate acrylonitrile butadiene styrene (PCABS), polyphthalamide (PPA), nylon, polyethylene terephtalate (PET), and polybutylene terephtalate (PBT). The lead frames 311~315 are formed inside the cavity when molding the package main body 310. The cavity is formed to a predetermined depth at an upper portion of the package main body 310, and may have an upper diameter larger than a lower diameter. For example, each side surface of the cavity may be formed so as to lean outward at 105-120 degree angle, thereby increasing the light emitting efficiency The plurality of lead frames 311~315 are formed at a lower portion of the cavity of the package main body 310 and are electrically disconnected with each other. Ends of the lead frames 311~315 penetrate the package main body 310 such that they are exposed outside and used as electrode leads.

The number of the lead frames 311~315 is smaller than that of electrodes of the plurality of LED chips 320, 330 and 340 by one. The lead frames 311~315 are spaced from each other by a predetermined distance and disposed in a line, in a length direction of the package main body 310.

The plurality of LED chips 320, 330 and 340 may be composed of LED chips of three colors or single colored LED chips. The LED chips of three colors may be a blue LED chip 320, a red LED chip 330, and a green LED chip 340. All of the single colored LED chips may be blue LED chips.

The plurality of LED chips 320, 330 and 340 include horizontal LED chips where two electrodes (N, P) are horizontally disposed at each upper portion of the LED chip. The LED chips 320, 330 and 340 are adhered to the lead frames 311~315 in the cavity or to the package main body 310 using a nonconductive adhesive. Here, the third lead frame 313 supports the red LED chip 330 or emits heat from the red LED chip 330.

When the LED chips 320, 330 and 340 are adhered, electrodes (N, P) of the LED chips 320, 330 and 340 are bonded to the lead frames 311, 312, 314, 315 through wires 321, 322, 331, 341 and 342, respectively.

In detail, the blue LED chip 320 has a horizontal electrode structure, and includes the P electrode connected to the first lead frame 311 through the wire 321 and the N electrode connected to the second lead frame 312 through the wire 322. The red LED chip 330 has a horizontal electrode structure, is disposed on the third lead frame 313, and includes the N electrode connected to the second lead frame 312 through the wire 331 and the P electrode connected to the fourth lead frame 314 through the wire 332. The green LED chip 340 has a horizontal electrode structure, and includes the P electrode connected to the fourth lead frame 314 through the wire 341 and the N electrode connected to the fifth lead frame 315 through the wire 342.

Here, the blue LED chip 320, the red LED chip 330, and the green LED chip 340 are connected to the four lead frames 311, 312, 314, 315 in series using the wires 321, 322, 331, 332, 341 and 342. Also, the disposition order of the LED chips 320, 330 and 340 may be changed.

The mold member 350 is formed in the cavity of the package main body 310. The mold member 350 is formed of resin such as transparent epoxy or silicon, and is filled within the cavity so as to electrically protect the LED chips 320, 330 and 340, the wires 321, 322, 331, 332, 341 and 342, and the bonding portion.

The mold member 350 may have a surface of a flat shape, a concave lens shape or a convex lens shape. Such a surface shape may be changed according to a use or an object of the LED package 300.

In the third embodiment of the present invention, the three LED chips 320, 330 and 340 are disposed in a horizontal electrode structure and connected in series, and the first lead frame 311 may be used as a P electrode lead and the fifth lead frame 315 may be used as an N electrode lead. Alternatively, the first lead frame 311 may be used as an N electrode lead and the fifth lead frame 315 may be used as a P electrode lead According to embodiments of the present invention, an output ratio of the LED chips may be controlled to determine a color of light to be emitted from the LED package. For example, when the output ratio of the red LED chip, the green LED chip, and the blue LED chip is 3:7:1, the LED package may emit white light.

In embodiments of the present invention, the number of lead frames is smaller than the number of the plurality of LED chips by one, but more lead frames may be formed according to the necessity such as radiation of heat.

Also, when the LED chips have been mounted inside the LED package, a silicate-based phosphor of a predetermined rate may be added into the mold member. Therefore, some of blue light generated from the blue LED chip is excited by the silicate-based phosphor and then emitted as yellow light. The yellow light is mixed with the blue light to emit white light.

According to an LED package of embodiments of the present invention, a circuit can be adaptably designed depending on an electrode structure of LED chips.

Also, the LED package can mount a plurality of LED chips therein to emit light of various colors from the LED chips, thereby emitting white light. The LED package is a side type LED package and can laterally provide light in a backlight unit or a portable terminal.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A light emitting diode package comprising:
a package body with a cavity, the package body comprising at least two protrusion portions and a recess portion disposed between the at least two protrusion portions;
a plurality of electrodes on the package body; and
a plurality of light emitting diode (LED) chips in the cavity;
wherein a bottom portion of the at least one of the plurality of electrodes is exposed through the recess portion, and
wherein the at least one of the electrodes is not electrically connected to the plurality of the LED chips.

2. The light emitting diode package according to claim 1, wherein a lateral width of the package body is greater than a maximum lateral width of the at least one of the plurality of electrodes.

3. The light emitting diode package according to claim 1, wherein the bottom portion exposed through the recess portion is not exposed to an outside surface of the package body.

4. The light emitting diode package according to claim 1, wherein the bottom portion exposed through the recess portion is not extended to a lateral surface of the package body.

5. The light emitting diode package according to claim 1, further comprising a phosphor disposed on the plurality of LED chips; and
a plurality of wires electrically connected to the plurality of LED chips in common.

6. The light emitting diode package according to claim 1, wherein at least one of the plurality of electrodes is exposed through the recess portion.

7. The light emitting diode package according to claim 1, wherein the bottom portion exposed through the recess portion is disposed between the at least two protrusion portions.

8. The light emitting diode package according to claim 1, wherein the bottom portion of the at least one of the plurality of electrodes exposed through the recess portion vertically overlaps with the at least one of the plurality of LED chips, and
a lateral width of the bottom portion of the at least one of the plurality of electrodes overlapped with the at least one of the plurality of LED chips is smaller than a lateral width of the at least one of the plurality of LED chips overlapped with the bottom portion of the at least one of the plurality of electrodes.

9. The light emitting diode package according to claim 1, wherein the at least one of the plurality of electrodes whose bottom portion is exposed through the recess portion penetrates the package body.

10. The light emitting diode package according to claim 1, wherein the bottom portion of the at least one of the plurality of electrodes is substantially flush with a bottom surface of the package body, and
wherein the bottom portion exposed through the recess portion is surrounded by the package body.

11. A light emitting diode package, comprising:
a package body having an upper portion including a cavity, and a lower portion having a recess portion being stepped down from the lowermost surface of the package body;
a plurality of LED chips in the cavity of the package body;
a plurality of electrodes on the package body,
wherein at least one of the electrodes passes through the package body such that the at least one of the electrodes is extended from the cavity of the package body to the recess portion of the lower portion of the package body, and
wherein the at least one of the electrodes is not electrically connected to the plurality of the LED chips.

12. The light emitting diode package according to claim 11, wherein the plurality of the LED chips are spaced from each other by a predetermined distance and disposed in a line in the cavity.

13. The light emitting diode package according to claim 11, wherein the package body comprising at least two protrusion portions and the recess portion disposed between the at least two protrusion portions.

14. The light emitting diode package according to claim 11, wherein a bottom portion of the at least one of the electrodes is exposed through the recess portion.

15. The light emitting diode package according to claim 11, wherein a bottom portion of the at least one of the electrodes is substantially flush with a bottom surface of the package body.

16. The light emitting diode package according to claim 11, further comprising a mold member in the cavity and a phosphor disposed in the mold member, wherein the at least one of the electrodes on the package body contacts the mold member or the phosphor.

17. The light emitting diode package according to claim 14, wherein the bottom portion exposed through the recess portion is disposed at a center of the package body.

18. The light emitting diode package according to claim 11 further comprising a plurality of wires electrically connected to the plurality of LED chips in common.

19. The light emitting diode package according to claim 11, wherein a width of the recess portion is larger than a width of the at least one of the plurality of electrodes whose bottom portion is exposed through the recess portion.

20. The light emitting diode package according to claim 14, wherein the bottom portion exposed through the recess portion is not extended to a lateral surface of the package body.

* * * * *